United States Patent [19]

Sullivan

[11] Patent Number: 4,591,265

[45] Date of Patent: May 27, 1986

[54] SYSTEM FOR CONTACT PRINTING WITH LIQUID PHOTOPOLYMERS

[76] Inventor: Donald F. Sullivan, 115 Cambridge Rd., King of Prussia, Pa. 19406

[21] Appl. No.: 664,431

[22] Filed: Oct. 24, 1984

Related U.S. Application Data

[63] Continuation-in-part of Ser. No. 364,309, Apr. 1, 1982, Pat. No. 4,506,004, and a continuation-in-part of Ser. No. 600,084, Apr. 13, 1984.

[51] Int. Cl.$^4$ .............................................. G03B 27/30
[52] U.S. Cl. ...................................... 355/100; 355/85
[58] Field of Search ..................... 355/78, 79, 85, 89, 355/99, 100

[56] References Cited

U.S. PATENT DOCUMENTS 3,751,164  8/1973  Miller et al. ...................... 355/100
4,070,110  1/1978  Ott ...................................... 355/100
4,087,182  5/1978  Aiba et al. ......................... 355/100

*Primary Examiner*—Richard A. Wintercorn
*Attorney, Agent, or Firm*—Laurence R. Brown

[57] ABSTRACT

A contact printing system produces photopatterned planar workpieces, such as printed wiring boards, with polymerized patterns on photopolymer coatings of precisely controlled thicknesses from a few microns to at least 0.003 in., with the workpieces ready for development by washing out unpolymerized portions. Mesh screens deposit the initial polymer coatings, on the workpiece and preferably also on a phototool image bearing surface, so that two layers are merged into one. A clamshell fixture permits the layers of pastelike consistency liquid photopolymer to be sandwiched in precise registration for photoexposure from an U. V. lamp radiation source. An operator can prepare one workpiece as another is being photoexposed. A second exposure chamber permits preexposure of the layer on the phototool with one surface exposed to air to permit partial polymerization through its thickness, so that when merged onto the workpiece layer in liquid to liquid bubble free contact, wiring traces and through holes are covered with polymerized polymer of controlled thickness. Boards are photoexposed on both sides before development, low energy is used and operator controlled steps are provided to produce high speed production of up to 60 double sided workpieces per hour.

21 Claims, 4 Drawing Figures

SYSTEM FOR CONTACT PRINTING WITH LIQUID PHOTOPOLYMERS

This invention is a continuation in part of both co-pending U.S. applications Ser. No. 364,309, filed Apr. 1, 1982, now U.S. Pat. No. 4,506,004, Issued Mar. 19, 1985, and Ser. No. 600,084 filed Apr. 13, 1984, both of which are incorporated herein by reference in their entirety. These applications respectively relate to (1) a process of producing solder mask coatings on printed wiring boards from two superimposed photopolymer layers, at least one of which is liquid photopolymer of pastelike consistency for covering conductive wiring traces, and (2) employing a clamshell type fixture in such a process for registering a photoimage pattern on a phototool carrying one of the two superimposed polymer layers with a further polymer layer on a wiring board to form a single merged photopolymer layer between the phototool and the wiring board ready for photopatterning.

TECHNICAL FIELD

This invention relates to printing systems and more particularly it relates to systems for photoprinting on photopolymer films deposited on discrete planar workpieces such as printed wiring boards.

BACKGROUND ART

Systems for printing printed wiring boards with liquid photopolymers are known, for example, U.S. Pat. No. 4,436,806, Issued Mar. 13, 1984 to F. J. Rendulic, et al. However, such prior art systems have several basic shortcomings, which are overcome by the present invention. For example, stencil printing systems cannot produce high resolutions such as necessary in modern printed circuit arts with very fine, closely spaced conductive wires. In photoimaging arts, off contact printing has many disadvantages, including high energy and corresponding heat and slowness problems because of the oxygen inibition of polymers. Furthermore for high resolution it is necessary to use collimated radiation, with corresponding large size and optical complexities.

Dry film processes require expensive polymers and auxiliary cover sheets, and many times need heat treatment or special adherence techniques, particularly if applied onto rough surfaces, where there is a tendency to entrap air bubbles that deteriorate adherence and resolution. Neither are they tolerant to coating thickness variations, which may be critical in many applications.

Liquid polymers are not heretofore well adapted to a wide variety of coating thicknesses. Generally, thin coatings are desired to reduce radiation energy for photoimaging, and to increase resolution, and to save polymer cost. Thus, commercial polymer lines with high quality control are not generally available to produce thick coatings, which provide unsatisfactory photo response in the presence of fillers, pigments and other ingredients, even if they were adapted to attain physically the desired thicknesses. My co-pending application, Ser. No. 650,109, Filed Sept. 13, 1984 thus provides a preferred liquid photopolymer for attainment of thick film layers, as are necessary if printed circuit boards are to be processed having thick conductive traces such as 0.004 in. (0.01 cm) extending from the insulation of the substrate. Because the photopolymer printing art has been generally confined to uncritical very thin film layers, generally stencilled onto the workpiece, the photoimaging techniques for high resolution and precise registration of optical images have not been highly developed, nor the ability to deal with thick layers, nor the attainment of good high resolution solder mask coatings consistent with precision printed wiring boards.

Special problems are posed by printed wiring boards with through holes, where it has not been feasible to use liquid photopolymers that run off into holes and prevent tenting over the holes with solder mask layers, for example.

A whole line of problems are introduced in processing apparatus because of inherent high costs of former systems and the limitations on processing speeds and product variations. Thus satisfactory photopatterning systems for high speed, low cost production of products including complex two sided printed wiring boards with semi-skilled operators have not heretofore been available in the art.

It is therefore an object of this invention to overcome the foregoing inefficiencies and problems of the prior art and to produce an improved high speed, low cost photoimaging system using liquid photopolymers, yet capable of high precision, high resolution production of a variety of product lines with semi-skilled operators. Other objects, features and advantages of the invention will be found throughout the following description, drawings and claims.

DISCLOSURE OF THE INVENTION

A system is provided for reproduction of photopatterned images on liquid photopolymer films placed as a layer on at least one surface of discrete planar substrate workpieces, such as printed wiring boards, positionable individually at a work station for photoexposure through a pattern image borne by a reusable phototool, preferably a thin film sheet, registered precisely with the workpiece. Both the workpiece and the phototool are planar bodies having on one surface a layer of liquid photopolymer in pastelike consistency that will not run off or change in shape as the bodies are handled. These bodies are then positioned parallel with the layers face to face but not in contact, and are then superimposed by a resilient blade drawn across the surface of the thin film phototool image bearing surface to form a single photopolymer layer of greater thickness sandwiched between the two bodies.

This sandwiching is achieved by a console mounted system having clamshell fixture pivoting the two planar bodies, from coplanar horizontal positions on side by side work station platforms where they receive respective photopolymer layers, into a sandwiched position with the two layers merged into a single layer. The sandwiching takes place on one work platform, the other of which can be rotated into a radiation chamber for photoexposing the single photopolymer layer. While the one clamshell held workpiece is being photoexposed, a new sandwich is being prepared on the other work station. For tenting, the opened clamshell holds the phototool in position over a second radiation chamber operable at the first work station on the phototool when the clamshell is opened so that the phototool carried layer is preexposed through the image carried by the phototool before sandwiching. Thus hardened liquid polymer pads are formed to tent through hole positions as desired.

When the clamshell fixture is opened for a new cycle the phototool and the workpiece each have a surface disposed horizontally in the same plane exposed for receiving thereon the layer of liquid photopolymer, which is deposited from a mesh screen of appropriate mesh to precisely control the layer thickness. A movable coating assembly on the console thus is placed over the two surfaces to impart simultaneously to the two surfaces a layer of liquid photopolymer in proper registered position. After the coating assembly is moved back out of the way, a flexible blade scanning member movable on the console provides for the merging of the two layers which have been positioned face to face by the clamshell fixture into one single layer. Both sides of the workpiece may be photoexposed in the system before a single development step of washing out soluble liquid photopolymer to leave the desired pattern formed by the phototool image is necessary thus eliminating the intermediate development of the image on one side before exposure of the image on the other side that is required in prior art systems.

Other features are provided such as a flexible phototool frame assuring tautness of the thin film phototool and air bubble free merging of the two liquid polymer layers.

BRIEF DESCRIPTION OF THE DRAWINGS

Throughout the respective views like features are identified by like reference characters to facilitate comparison. There is shown in.

THE PREFERRED EMBODIMENT

Figure 1:
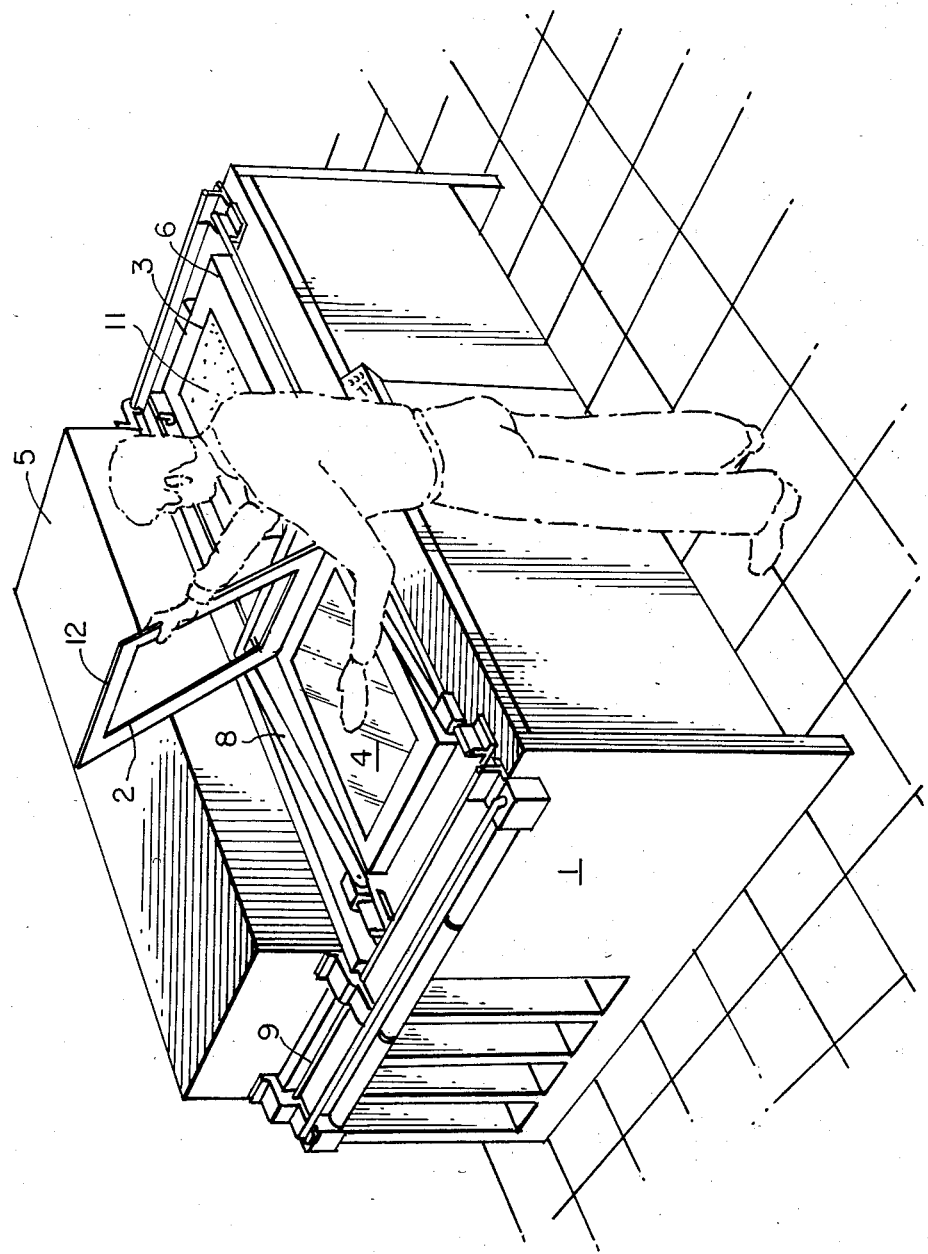
FIG. 1 a perspective sketch of a printing console being attended by an operator, FIG. 2 a perspective, partly broken away, sketch of the console showing its two work stations, FIG. 3 a sketch of a clamshell fixture as used in the system for registering precisely a photo image with a workpiece for photopatterning a polymer layer therebetween.
Figure 2:
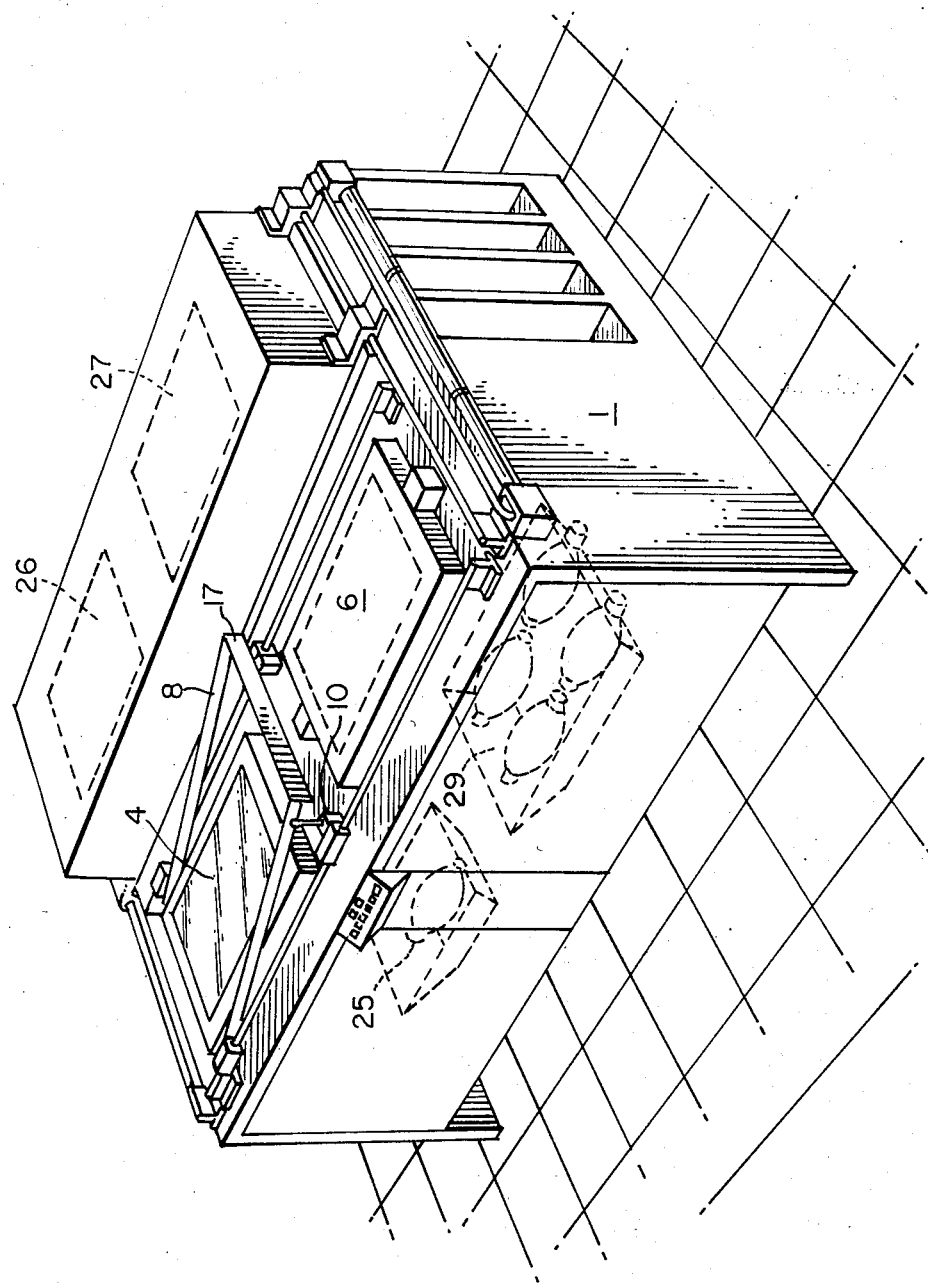

The console 1, housing the system afforded by this invention, is shown in FIGS. 1 and 2. The system comprises a semi automatic system for reproduction of photpatterned images on liquid photopolymer films placed as a layer on at least one surface of a planar substrate, such as a printed wiring board 3, for photoexposure through a pattern borne by a reusable phototool, preferably comprising a thin plastic film 2.

Two platforms horizontally disposed as work stations 4 and 6 thus may respectively receive the image bearing phototool 2 and the printed wiring board workpiece 3 to be photopatterned with a polymer layer of a desired pattern. The surfaces of the phototool 2 and the workpiece 3 to be mated together for contact photoprinting on a photopolymer layer sandwiched therebetween are disposed upwardly on the respective work surfaces 4 and 6 in the same horizontal plane. When this condition is attained, semi-automatically by means of the operator, the coating assembly 5 is moved into position over the work stations 4 and 6, preferably automatically by means of the front panel control buttons.

The operator then from mesh screens 26 and 27 in the coating assembly 5 proceeds to coat both the image bearing surface of the phototool 2 and the surface of the workpiece 3 with a layer of photopolymer precisely controlled in thickness. This is attained by choice of a polymer of appropriate viscosity and other characteristics such as photo response and insulation properties, etc., together with a mesh screen of proper mesh to control the layer thickness. In this manner the photopolymer layers can be applied in thicknesses of the order of a few microns (ten thousandths of a millimeter) to at least 0.003 in. (0.8 mm), as the particular application requires. Thus, a variable thickness coating of precise thickness is provided. It is important in accordance with this invention to provide a liquid photopolymer of pastelike consistency, which therefore excludes air pockets upon application, and even more importantly, will cover rough contours such as encountered on printed wiring boards having conductors etched thereon. The coated objects may be handled without the liquid photopolymer changing shape or running off or running into through holes in printed wiring boards, etc. It is required for precision photopatterning as afforded by this invention that resolution be high and that the shaping, positioning and thickness of photopolymer layers be precisely controllable. Note that this system will permit either one, or both of the surfaces at the respective work stations to by coated with a polymer layer. The polymer may be the same in each instance, or may be different, as for example to give better adherence characteristics to copper wiring traces or to provide better heat resistance for solder masking.

After the polymer coating step, the coating assembly 5 is returned to the position shown in the drawings by moving backwards along rail 9, thus leaving the work stations 4 and 6 free for further processing steps. The next step of pre-exposing exposing only that layer of liquid photopolymer placed on the phototool to harden predetermined areas is optional but preferred when the workpieces are printed wiring boards having either through holes or etched wiring conductors, for overcoating. Thus the hardened areas tent the through holes and serve to assure a predetermined thickness of coating over conductor traces on a printed wiring board, even if the combined thicknesses of the two layers are not enough to assure that the conductors are covered. For this purpose, the work surface 4 is a clear glass plate overlying a radiation chamber containing the U. V. lamp radiation source 25. Thus the photopolymer layer on the phototool may be photoexposed through the image pattern before the respective layers on the phototool and the workpiece are merged into a single layer. With one surface of the polymer layer on the phototool exposed to air, the exposure through the phototool image carrier sheet from the radiation chamber 25 will polymerize the polymer layer in the image pattern partly through the thickness of the layer leaving the air exposed surface with its pastelike consistency, because of oxygen inhibition to polymerization, and thus ideally preparing the polymer layer for merging into a single layer when positioned face to face with another liquid polymer pastelike surface.

Figure 3:
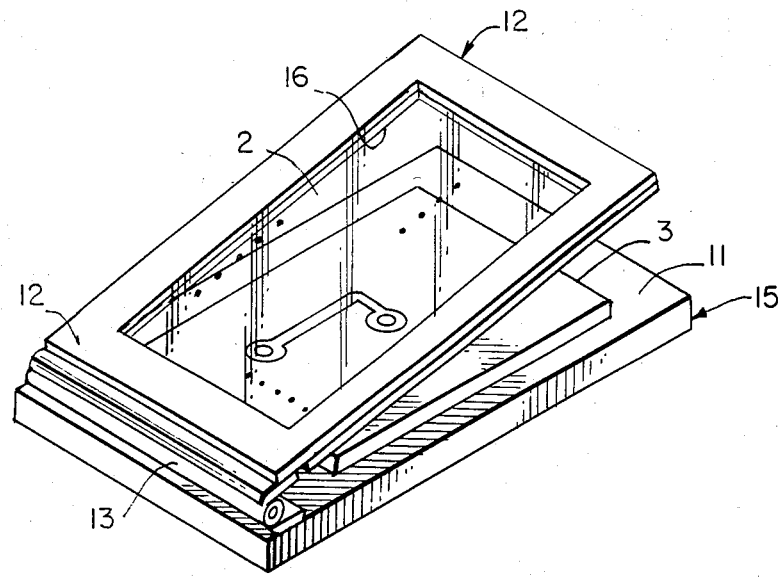
Figure 4:
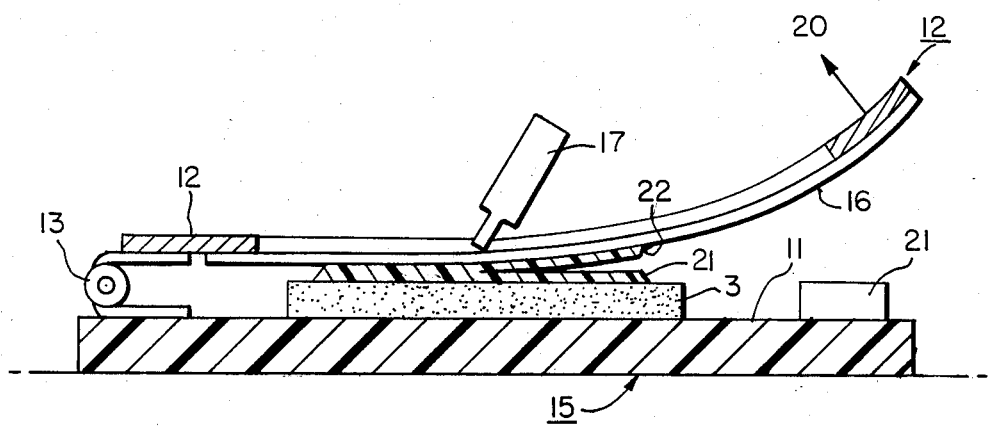
FIG. 4 is an end view sketch, partly in cross section illustrating the sandwiching procedure forming the single photopolymer layer between the phototool image and the workpiece held precisely in registration by the clamshell type fixture.

Reference is now made to FIGS. 3 and 4, wherein a clamshell fixture is shown having plate 15 hinged at 13 for pivoting the phototool 2 retaining frame 12 in a clamshell type pivot mode. The surface 11 of plate 15 has means for precisely mounting in a registered position the panel workpiece 3, such as a printed circuit board. Thus the image pattern on the phototool may be precisely positioned in registration with the workpiece within even the tolerances required for registering patterns on the very detailed wiring configurations on modern printed wiring boards.

As explained in more detail in the parent application Ser. No. 364,309, a resilient blade type squeegee 17 merges together the photopolymer layer 22 on the phototool and the photopolymer layer 21 on the workpiece 3 to form a single layer of photopolymer sandwiched between the phototool and workpiece surfaces, as the squeegee is scanned from left to right as shown in the drawing.

In accordance with this invention, the phototool frame 12, or more generally the clamshell fixture, has flexible side members 16 providing a resiliently deformable curvature diverging away from the substrate forming panel 15 from the hinge position outwardly. The biased bending force on the frame is identified in the drawing as 20. This provides not only a means holding taut the phototool, preferably comprising a thin film, but also means controlling the sequential contact of the two layers 21 and 22 during scanning to prevent entrapment of air bubbles between the layers being merged. Thus a less precise adjacent mounting structure is required for attaining from a flexible thin film phototool carrier body precise registration in a distortionless merging of the two partial layers 21 and 22. Thereby the clamshell fixture may be simply opened to strip the phototool from the sandwich after exposure, and may be simply closed and scanned to merge the two polymer surfaces together with enough gravity holding force to remain in sandwich form until exposed and stripped, even if handled and moved physically from place to place.

On the console of FIGS. 1 and 2 is a semi-automatic scanning device, comprising framework 8 for guiding the resilient blade 17, an air cylinder 10 for pulling down the squeegee and moving it along the rails 11 for the sandwiching step. This is done with the clamshell fixture closed and resident in suitable registering means at the work surface 6. In the open clamshell fixture position, the phototool and the workpiece are appropriately registered on the respective work stations 4 and 6.

The work surface 6 is on a two surfaced rotatable body, which on the underside is disposed within the exposure chamber 29 having radiation lamps therein. Thus during the sandwiching step one formerly prepared sandwich is being exposed in chamber 29 to substantially increase the production rate at which workpieces may be photoimaged. As each sandwich is completed, the rotatable body is rotated to photoexpose the piece just completed on the work surface 6.

This system also provides imaging on both sides of the workpiece with the distinct advantage of providing the photoexposure on both sides before a single development cycle provides for the wash out of unhardened polymer. For such purpose the workpiece 3 after photopatterning on one side is simply turned over after stripping off the phototool frame 12 and registered on the plate 15, preferably with a paper layer between the workpiece surface with the photoexposed polymer layer, and the same process repeated. The development in the solvent spray bath is preferably done at a remote location.

With this system a throughput of sixty double sided printed wiring boards per hour may be achieved, with the following parameters:

5 KW mercury vapor lamps, 18 by 24 inch image size, 60 mesh polyester coating screen, 0.003 inch thick layers on the phototool and workpiece, with 0.002 inch depth of polymerization of the coating on the phototool.

Resolutions of five microns may be achieved without collimated light. Preferably reflective metalized photo image patterns are disposed on the phototool to reduce heat build up. The above coating thicknesses will cover etched conductor traces of 0.004 inch thickness with a constant thickness of the 0.002 inch of polymerized photopolymer to provide ample solder coat protection, for example, when a photopolymer of appropriate resist charactreristics is used.

It is clear from the foregoing that this invention has provided an improved system for producing printed wiring boards with photopatterned polymer coatings thereon in a contact printing mode, which provides high resolution with uncollimated radiation sources at low energy levels with simplified equipment at high production speeds. The system thus may be packaged in a console having therein the means for sequentially effecting the necessary steps for producing on a workpiece a photopatterned exposed photopolymer layer of a precise thickness and high resolution pattern, ready for the development step of selectively washing out the soluble or unpolymerized portions of the photoexposed photopolymer layer.

Thus a typical console packaged system incorporates, (a) a work station presenting the wiring board at a planar work surface, (b) a coating assembly movable over the printed wiring board for coating through a mesh screen on the board a coating of controlled uniform thickness, (c) means, such as a clamshell fixture, for registering on the wiring board a phototool image bearing surface in contact with the photopolymer layer for contact printing, and (d) a radiation source located with appropriate power and spacing in a radiation chamber to photoexpose the photopolymer layer through the image bearing surface in contact therewith in a desired pattern to change the solubility characteristics of the polymer layer by polymerization.

Some of the attendant advantages of this equipment and system provided by this invention are: (a) much lower energy requirement because of a combination of features including the contact printing to exclude oxygen surface inhibition of polymerization, the use of uncollimated radiation making the useful efficiency of the radiation source higher and the ability to precisely control the polymer layer thickness to exactly that necessary for any particular application, (b) greater production speeds because of such features as the simultaneous preparation of coatings on one workpiece while photoexposing another workpiece, coating and photoexposing on two sides of the workpiece before the development step of washing out unpolymerized polymer, and the short exposure times provided by the contact printing mode, (c) improved product quality and resolution attained by contact printing, layer thickness control and precise registration of images and workpieces, (d) better polymer coating characteristics over wiring patterns and through holes on the workpiece, attained by preexposing for polymerization to a controlled depth the photopolymer thereby assuring that the liquid photopolymer is not thinned out or starved over the conductors and does not run into through holes, and (e) many production economies including the use of low cost liquid photopolymers, the simple technique of covering rough workpiece surfaces without air bubble distortion with a pasatelike consistency liquid photopolymer layer, the improved energy effiency, fast production techniques afforded by the apparatus and the feasibility of semi-skilled labor operators of interspersed manual steps, and low cost, space saving, equipment made possible by the contact printing and various equipment interrelationships.

Having therefore improved the state of the art, those novel features believed descriptive of the nature and the spirit of the invention are defined with particularity in the following claims.

I claim:

1. A system for reproduction of photopatterned images on liquid photopolymer films placed as a layer on at least one surface of a planar substrate for photoexposure through a pattern carried upon a reusable image bearing phototool having an image bearing surface, comprising in combination, a console having a radiation source for photoexposing the liquid photopolymer layer to change its solubility characteristics for permitting development of a pattern therein by selectively washing out a soluble portion thereof, means for registering the substrate and phototool surfaces adjacent to each other on said console with a single layer of photopolymer sandwiched therebetween and in contact with the respective surfaces thereof, and means for positioning the single photopolymer layer in surface contact with the image bearing surface of the phototool to receive radiation from the radiation source for photopatterning the image pattern by contact printing on the liquid polymer layer through the phototool.

2. A system for reproduction of photopatterned images on liquid photopolymer films placed as a layer on at least one surface of a planar substrate for photoexposure through a pattern carried upon a reusable image bearing phototool, comprising in combination, a console having a radiation source for photoexposing the liquid photopolymer layer to change its solubility characteristics for permitting development of a pattern therein by selectively washing out a soluble portion thereof, means for registering the substrate and phototool surfaces adjacent to each other on said console with a single layer of photopolymer sandwiched therebetween and in contact with the respective surfaces thereof, means for positioning the single photopolymer layer to receive radiation from the radiation source for photopatterning the image pattern thereon through the phototool, means mounted on the console for positioning the substrate planar surface for receiving thereupon a thin film layer of said liquid photopolymer of a paste-like consistency adhering thereto in a stable condition without displacement during positioning of the substrate surface, and means positioned on the console for registering adjacent to said substrate surface mesh screen means for depositing from the mesh screen a thin photopolymer layer of predetermined thickness metered by the screen mesh.

3. A system as defined in claim 2 further comprising, means mounted on the console for positioning the phototool planar surface for receiving thereupon a thin film layer of said liquid photopolymer, and means for forming said single layer by superimposing said layers on the phototool and substrate.

4. A system as defined in claim 3, wherein said means for forming a single layer comprises a clamshell fixture hinging together two mounting panels for holding and registering respectively said phototool and said substrate in position for closing the clamshell for photopatterning said image at a precise position onto the substrate.

5. A system as defined in claim 4 wherein the clamshell arrangement has a flexible phototool mounting panel providing a resilient curving member diverging away from the substrate holding panel from the hinge position outwardly in the closed clamshell position before the two layers are merged into a single layer by forcing them together.

6. A system as defined in claim 4 wherein the console mounts said radiation source at a position in registry with the substrate when the clamshell fixture is opened with the phototool and the substrate lying in the same plane, and having a further radiation source mounted for photoexposing the layer of photopolymer on the phototool before the clamshell is closed to form said single layer.

7. The system defined in claim 6 wherein the substrate is a printed circuit board with through holes defined therein, and the image provides a pattern for exposing the layer of photopolymer on the phototool in positions registering with the through holes for hardening the photopolymer on the phototool when it is exposed by the second said radiation source, for tenting the through holes.

8. A system as defined in claim 3 wherein said console provides side by side work stations for receiving the phototool and substrate in coplanar positions, and movable means mounted on the console positionable over the two work stations for coating the coplanar phototool and substrate with layers of photopolymer.

9. A system as defined in claim 3 wherein the means for forming the single layer comprises means for positioning the liquid photopolymer layers on the phototool and substrate face to face and slightly spaced from each other, and means for scanning the layers with an instrument forcing the two liquid layers into contact to form said single layer.

10. A system for reproduction of photopatterned images on liquid photopolymer films placed as a layer on at least one surface of a planar substrate for photoexposure through a pattern carried upon a reusable image bearing phototool, comprising in combination, a console having a radiation source for photoexposing the liquid photopolymer layer to change its solubility characteristics for permitting development of a pattern therein by selectively washing out a soluble portion thereof, means for registering the substrate and phototool surfaces adjacent to each other on said console with a single layer of photopolymer sandwiched therebetween and in contact with the respective surfaces thereof, and means for positioning the single photopolymer layer to receive radiation from the radiation source for photopatterning the image pattern thereon through the phototool, wherein said means for positioning the photopolymer layer to receive radiation comprises a rotatable two sided work surface positionable with one side adapted to receive the substrate on a work surface accessible to an operator and with the other surface adapted to hold a further substrate registered with the radiation source for photoexposure.

11. A system as defined in claim 10 having stations and accompanying means on the console for positioning and registering the phototool and substrate in successive positions for performance of the operator assisted photopatterning intermediate steps of (1) positioning both the substrate and phototool for receiving a layer of liquid photopolymer thereupon, (2) merging these layers of photopolymer together into a single thicker layer, and (3) photoexposing the single layer by said radiation source through the phototool image.

12. A system as defined in claim 11 further including means for photoexposing the layer of photopolymer on the phototool through the image before merging the two layers.

13. A system as defined in claim 11 further including means on said console movably positionable into position adjacent to the substrate and phototool surfaces for coating these surfaces with a liquid photopolymer layer of a predetermined variable thickness between a few microns (one thousandth of a millimeter) to at least 0.003 in. (0.08 mm).

14. A system as defined in claim 11 further including means for processing photopatterned images on both sides of said substrate before a development step of washing out the soluble portions of the photopatterned images on the substrate.

15. A system for reproduction of photopatterned images on liquid photopolymer films placed as a layer on at least one surface of discrete planar substrate workpieces positionable individually at a work station for photoexposure of a pattern imaged upon a reusable image bearing planar phototool body movably positionable in registration adjacent a workpiece for photopatterning the image on the photopolymer layer, comprising in combination, means for depositing on a workpiece a first photopolymer layer, means for depositing a second photopolymer layer in contact with said pattern imaged on the phototool, means for merging the respective photopolymer layers into a single layer, means for radiating the single layer through the pattern imaged on the phototool to produce a change of solubility in said single layer of a pattern corresponding to the pattern imaged on said phototool, and means for removing the phototool from a radiated single layer for development of the pattern on the workpiece.

16. A system for reproduction of photopatterned images on liquid photopolymer films placed as a layer on at least one surface of discrete planar substrate workpieces positionable individually at a work station for photoexposure of a pattern imaged upon a reusable image bearing planar phototool body movably positionable in registration adjacent a workpiece for photopatterning the image on the photopolymer layer, comprising in combination, means for sandwiching a workpiece with a photopolymer layer thereon with the phototool having a photopolymer layer on said pattern imaged on the phototool to merge the respective photopolymer layers into a single layer, means for radiating the single layer through the pattern imaged on the phototool to produce a change of solubility in said single layer of a pattern corresponding to the pattern imaged on said phototool, and means for removing the phototool from a radiated single layer for development of the pattern on the workpiece, wherein the workpiece is a printed wiring board with a conductor pattern thereon before coating with a layer of photopolymer with conductor traces extending from the substrate surface a distance greater than the thickness of the photopolymer layer on the workpiece but less than the thickness of the single photopolymer layer.

17. Apparatus for producing a solder mask coating pattern on a printed wiring board having electrical conductors disposed on an insulating surface to leave exposed only predetermined areas of the conductors to which solder will adhere, comprising in combination, a self contained console having means therein for positioning the board and photoimaging thereon said coating comprising, means for coating a layer of liquid photopolymer of pastelike consistency over the printed wiring board rough contour surface configuration to exclude air pockets between the layer and the rough contour board surface, means for depositing a layer of solder mask photopolymer on a carrier surface and superimposing it as an outer surface layer onto the liquid polymer layer on the board to form a single photopolymer layer of increased thickness, and means for exposing the single photopolymer layer to radiation from a radiation source through a phototool image forming said solder coat pattern therein by changing the solubility of the photopolymer layer in response to the radiation.

18. Apparatus as defined in claim 17 wherein the carrier surface comprises a taut flexible member and the means for superimposing comprises means for drawing a resilient blade across the taut member when disposed adjacent to but separated slightly from the polymer layer on the board, thereby contacting and adhering the two layers without interspersed air bubbles.

19. Apparatus as defined in claim 17 further comprising means for photoexposing the polymer layer on said carrier surface through the phototool image prior to superimposing the two layers.

20. Apparatus as defined in claim 17 further comprising means for depositing the layer of solder mask photopolymer as a liquid polymer layer directly upon the phototool image as the carrier surface.

21. A contact printing system for producing solder mask coatings on printed wiring boards with conductors etched on one surface thereof with photopatterned polymer coatings thereon, comprising in combination, a console having therein a multiplicity of means for sequentially effecting production steps for photopatterning the polymer coating on a wiring board workpiece, including, (a) a work station presenting the wiring board at a planar work surface, (b) a coating assembly movable over the printed wiring board to coat the surface with the conductors etched thereon with a liquid photopolymer layer of pastelike consistency of controlled thickness excluding air pockets over rough contours presented by the etched conductors, (c) means for registering on the wiring board in contact with the photopolymer layer a phototool image bearing surface, and (d) means for radiating the photopolymer layer through the image bearing surface to photoexpose a desired pattern by changing the solubility characteristics of the polymer layer.

* * * * *